US012556157B1

(12) United States Patent
Daneman et al.

(10) Patent No.: US 12,556,157 B1
(45) Date of Patent: Feb. 17, 2026

(54) LATERALLY-DOPED MEMS RESONATOR WITH PIEZOELECTRIC LAYER

(71) Applicant: SiTime Corporation, Santa Clara, CA (US)

(72) Inventors: Michael Julian Daneman, Campbell, CA (US); Charles I. Grosjean, Los Gatos, CA (US); Aaron Partridge, Cupertino, CA (US); Paul M. Hagelin, Saratoga, CA (US)

(73) Assignee: SiTime Corporation, Santa Clara, CA (US)

( * ) Notice: Subject to any disclaimer, the term of this patent is extended or adjusted under 35 U.S.C. 154(b) by 1131 days.

(21) Appl. No.: 15/912,551

(22) Filed: Mar. 5, 2018

Related U.S. Application Data (63) Continuation-in-part of application No. 15/897,135, filed on Feb. 14, 2018, now Pat. No. 10,696,547.

(60) Provisional application No. 62/466,437, filed on Mar. 3, 2017, provisional application No. 62/459,017, filed on Feb. 14, 2017.

(51) Int. Cl.
*H03H 9/02* (2006.01)
*B81B 7/00* (2006.01)
*B81B 7/02* (2006.01)
*B81C 1/00* (2006.01)
*H03H 9/13* (2006.01)
*H03H 9/15* (2006.01)

(52) U.S. Cl.
CPC ....... *H03H 9/02244* (2013.01); *B81B 7/0006* (2013.01); *B81B 7/02* (2013.01); *B81C 1/0069* (2013.01); *H03H 9/131* (2013.01); *H03H 9/15* (2013.01); *H03H 2009/155* (2013.01)

(58) Field of Classification Search
CPC ...... H03H 9/02244; H03H 9/15; H03H 9/131; H03H 2009/155; B81C 1/0069; B81B 7/0006; B81B 7/02
See application file for complete search history.

(56) References Cited

U.S. PATENT DOCUMENTS

| 7,369,003 B2 | 5/2008 | Hagelin | |
| 7,369,004 B2 | 5/2008 | Partridge | |
| 8,689,426 B2 * | 4/2014 | Thalmayr | H10N 30/04 701/472 |
| 8,916,407 B1 * | 12/2014 | Grosjean | H03H 3/0076 438/51 |

(Continued)

FOREIGN PATENT DOCUMENTS

WO WO 2016205770 * 12/2016

OTHER PUBLICATIONS

Melamud et al, "Effects of Stress on the temperature cofficient of frequency in double clamped resonators," IEEE 13th int. Conf. on solid state sensors, actuator and Micro. 2005 (Year: 2005).*

(Continued)

Primary Examiner — Matthew L Reames
(74) Attorney, Agent, or Firm — Marc P. Schuyler (57) ABSTRACT

A semiconductor device includes a first silicon layer with first and second regions of substantially different dopant concentration and a resonant MEMS member formed in the first region. A piezoelectric layer is disposed over the resonant MEMS member and conductive material is disposed over the piezoelectric layer and patterned to form first and second electrodes.

22 Claims, 10 Drawing Sheets

(56) References Cited

U.S. PATENT DOCUMENTS

| | | | |
|---|---|---|---|
| 9,022,644 B1* | 5/2015 | Arft | G01K 7/226 374/116 |
| 9,559,660 B2 | 1/2017 | Pensala | |
| 9,705,470 B1 | 7/2017 | Doll | |
| 9,712,128 B2 | 7/2017 | Doll | |
| 9,774,313 B1 | 9/2017 | Grosjean | |
| 10,218,333 B2 | 2/2019 | Doll | |
| 10,247,621 B1 | 4/2019 | Partridge | |
| 10,263,596 B2 | 4/2019 | Doll | |
| 10,476,477 B1 | 11/2019 | Grosjean | |
| 10,622,973 B1 | 4/2020 | Partridge | |
| 10,892,733 B2 | 1/2021 | Doll | |
| 2009/0243747 A1* | 10/2009 | Gaidarzhy | H03H 9/02409 333/17.1 |
| 2011/0156175 A1* | 6/2011 | Mohanakrishnaswamy | B81C 1/00246 257/414 |
| 2012/0305542 A1* | 12/2012 | Donnay | H03L 1/022 219/412 |
| 2015/0162523 A1* | 6/2015 | Umeda | H01L 41/0478 310/331 |
| 2016/0072473 A1* | 3/2016 | Nishimura | H03H 9/21 310/370 |
| 2016/0130137 A1* | 5/2016 | Huang | B81B 7/02 257/415 |
| 2016/0211826 A1* | 7/2016 | Abdolvand | H03H 9/02244 |
| 2016/0352307 A1* | 12/2016 | Kaajakari | H03H 9/171 |
| 2018/0127268 A1* | 5/2018 | Fukumitsu | H01L 23/02 |
| 2020/0028485 A1 | 1/2020 | Doll | |

OTHER PUBLICATIONS

Jha Stanford online website "High Precision Mems Digital Temperature Sensor," http://micromachine.stanford.edu/~cmjha/Digital%20temperature%20sensor.html (Year: 2015).*

Khamoushi Tampere University of Technology website "Temperature Coefficient of Resonant Frequency (TcF)," http://www.students.tut.fi/~khamousk/TCF.htm (Year: 2014).*

Ghahsareh, "Frequency in thin film Piezoelectric on substrate oscilators," dissertation 2013 Oklahoma University (Year: 2013).*

Fei et al. "Temperature Characteristics of a Contour Mode MEMS AlN piezoelectric Ring Resonator on SOI substrate," Micromachines 2021, 12, 143. https://doi.org/10.3390/mi12020143 (Year: 2021).*

C. Lin et al., "Experimental study of temperature-compensated aluminum nitride Lamb wave resonators," 2009 IEEE International Frequency Control Symposium Joint with the 22nd European Frequency and Time forum, 2009, pp. 5-9, doi: 10.1109/FREQ.2009.5168132. (Year: 2009).*

E. J. Ng, V. A. Hong, Y. Yang, C. H. Ahn, C. L. M. Everhart and T. W. Kenny, "Temperature Dependence of the Elastic Constants of Doped Silicon," in Journal of Microelectromechanical Systems, vol. 24, No. 3, pp. 730-741, Jun. 2015, doi: 10.1109/JMEMS.2014.2347205. (Year: 2015).*

Hajaam, Arash, "Sub-100ppb/° C. Temperature Stability in Thermally Actuated High Frequency Silicon Resonators via Degenerate Phosphorous Doping and Bias Current Optimization," Jan. 2011, IEDM Tech. Dig.. 7.5.1-7.5.4. 10.1109/IEDM.2010.5703317, 4 pages.

* cited by examiner

LATERALLY-DOPED MEMS RESONATOR WITH PIEZOELECTRIC LAYER

CROSS-REFERENCE TO RELATED APPLICATIONS

This application hereby claims priority to U.S. Provisional Patent Application No. 62/466,437 filed Mar. 3, 2017 and is a continuation-in-part of U.S. application Ser. No. 15/897,135 filed Feb. 14, 2018, which claims priority to U.S. Provisional Patent Application No. 62/459,017 filed Feb. 14, 2017. Each of the foregoing applications is hereby incorporated by reference in its entirety.

TECHNICAL FIELD

The disclosure herein relates to microelectromechanical systems (MEMS).

INTRODUCTION

MEMS structures are conventionally sealed in a low-pressure or controlled-pressure chamber through growth of an epitaxial silicon lid, a high-temperature deposition process that may degrade temperature-sensitive materials and/or result in undesired deposition in emerging MEMS solutions.

DRAWINGS

The various embodiments disclosed herein are illustrated by way of example, and not by way of limitation, in the figures of the accompanying drawings and in which like reference numerals refer to similar elements and in which:

FIGS. 13 and 14 illustrate exemplary processes for implementing the MEMS depicted in FIG. 12; and.

DETAILED DESCRIPTION

In various embodiments disclosed herein, vents through which an etchant enters to remove sacrificial oxide and thereby define (release) a MEMS element are plugged through strategic material deposition without the high process temperatures and/or inadvertent material depositions associated with conventional epitaxial lid formation. In a number of embodiments, for example, oxide-release vents formed within a silicon lid layer are plugged by metal deposition (e.g., sputtered, evaporated or chemical-vapor-deposited (CVD) metal) at less than half the temperature typically required by epitaxial silicon growth, permitting application with thermally sensitive thin piezo-electric films (e.g., aluminum-nitride) and/or avoiding undesired material deposition onto (or roughening or other degrading of) such films or other material layers. In other embodiments, oxide-release vents are formed with relatively narrow lateral passageways that avoid line-of-sight access into the MEMS chamber and/or narrow vertical passageways that, in either case, may be plugged with no or negligible sealant deposition within the MEMS chamber. In yet other embodiments, process efficiencies are realized through concurrent formation of oxide-release vents, contact-via trenches and isolation trenches (or any subset thereof), and/or concurrent disposition of material(s) within such trenches and release vents.

In further embodiments presented herein, doping (including degenerate doping) depth for a thermal drive of a given duration is increased by etching or otherwise forming chamber-defining slots within device-layer silicon and depositing a dopant-source film on the sidewalls of the slots prior to the thermal drive. Through this lateral doping approach (which may be combined with surface-layer doping) the diffusion time is only limited by the spacing of the slots rather than the thickness of the silicon film. The slots may also serve a dual purpose—not only enabling more rapid (or deeper) doping, but also defining the silicon MEMS structure of the resonator (i.e., defining sides of the silicon portion of the resonant MEMS structure).

Figure 1:
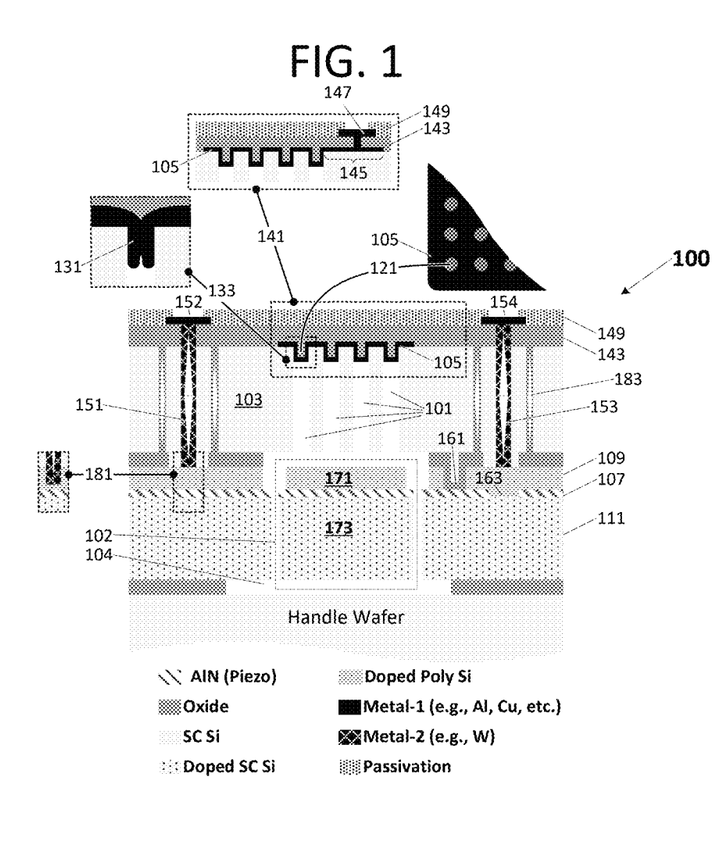
FIG. 1 illustrates an embodiment of a MEMS device in which oxide-release vents are sealed via metal-seal deposition at vent openings in a silicon lid-layer.

FIG. 1 illustrates an embodiment of a MEMS device 100 in which oxide-release vents 101 are sealed (plugged, blocked, closed-off, etc.) via metal-seal deposition (105) at vent openings in silicon lid-layer 103. In general, metal seal 105 is formed by metal sputtering (e.g., copper (Cu) or aluminum—any practical metal/metal-alloy and deposition process may be used) at a temperature less than 400 degrees Celsius (° C.) and thus less than half the temperature required (typically above 1000° C.) for silicon epitaxy. In the exemplary piezo-actuated MEMS resonator device shown, sealing oxide-release vents 101 through low-temperature metal deposition avoids degrading (damaging, destroying) heat-intolerant piezoelectric layer 107 (e.g., aluminum nitride or lead-zirconium-titanate, though other piezoelectric materials may be used) and also avoids undesired sealant deposition on the doped polysilicon electrode layer 109 and piezoelectric layer 107 which may otherwise degrade those materials (e.g., erode or roughen the polysilicon) and/or bridge the void between the MEMS resonator 102 and surrounding field area (resulting in electrical short-circuit, mechanical disruption, etc.). In other embodiments, including those lacking heat-intolerant material layers (e.g., electrostatically actuated MEMS resonators, MEMS accelerometer masses, MEMS thermistors, etc.), oxide-release vents 101 and lid-silicon metal seal 105 may be strategically positioned to avoid sealant intrusion into the MEMS chamber (i.e., cavity 104, again avoiding undesired mechanical disruption or electrical short-circuit. Accordingly, while the exemplary piezo-actuated resonator structure shown in FIG. 1 (piezoelectric layer sandwiched between doped single-crystal silicon and doped polysilicon) is carried forward in various examples herein, the oxide-vent sealing structures and processes may, in all cases, be applied with respect to MEMS structures formed from other material stacks, single-layer structures (e.g., MEMS resonators or other structures constituted by a single material layer) and multi-layer structures that lack a piezoelectric material layer and/or doped or conductive material layer.

Still referring to FIG. 1, oxide-release vents 101 may be specifically sized (i.e., aperture with specific cross-sectional area as shown by the exemplary circular geometry in top-view 121) to enable a desired metal ingress/fill as shown by the sealed region 131 in detail view 133. For example (and without limitation), in sputtered-metal seal implementations (e.g., Cu, Al, etc.), vent/aperture diameter (or cross-sectional area) may be defined by lithographic patterning to yield a dimension of less than 2 microns (μm) and a depth-to-width aspect-ratio of 5 or greater. Further, the metal vent cover (vent cap) may be electrically coupled to an electrical contact (e.g., a ground contact) as shown in detail view 141. In that case, a relatively shallow electrical via may be formed through surface oxide 143 to interconnect vent seal 105 (which may include a lateral extension 145 for that purpose) with metal contact feature 147, itself exposed through an opening in passivation layer 149.

In the FIG. 1 embodiment, electrical vias 151 and 153 extend through the lid-layer silicon 103 to contact sub-surface structures (e.g., MEMS resonator drive/sense electrode(s), MEMS resonator-bias electrode(s), thermistor terminals, MEMS accelerometer-mass bias/sense electrodes, etc.). In the specific piezo-actuated resonator implementation shown, polysilicon layer 109 and device-layer single-crystal silicon 111 are sufficiently doped (e.g., degenerately doped) to serve as electrical conductors, so that via 151 extends from a surface contact 152 to a first actuation electrode in polysilicon layer 109 while via 153 extends from surface contact 154 to a second actuation electrode in single-crystal silicon layer 111 (i.e., formed by interconnection of a region of polysilicon layer 109 isolated by oxide-lined channel 161 to single-crystal silicon layer 111 through opening 163 in piezoelectric layer 107). Though not specifically visible in the depicted cross-section, the region of polysilicon layer 109 contacted by via 151 is continuous with respect to polysilicon feature 171 in the material stack of resonator 102 (e.g., continuous by virtue of a tethering structure that connects/anchors the otherwise released MEMS resonator 102 to the surrounding/field area of the device), while single-crystal silicon region contacted by via 153 (through piezoelectric layer opening 163) is likewise contiguous with respect to single-crystal silicon layer 173 in the resonator material stack, meaning that contacts 152 and 154 are electrically coupled to regions 171 and 173, respectively, and thus to electrodes on either side of piezoelectric region 107 within MEMS resonator 102. Accordingly, a time-varying potential may be applied across contacts 152 and 154 to produce corresponding time-varying piezoelectric expansion and contraction of resonator piezoelectric layer to drive resonator 102 into mechanical resonance in one or more modes (e.g., extensional, flexural, shear, breath-mode, etc.). As discussed, other contacts and corresponding vias may be provided to effectuate resonator bias, device grounding, etc., and the contacts/vias shown may be used to convey signals and voltages other than resonator actuation signals (e.g., signals indicative of resonant motion, resistance of MEMS thermistor element, relative position of MEMS element within cavity 104, etc.).

While vias 151 and 153 are depicted as trench-isolated conductors (i.e., metal such as tungsten (W) or selective tungsten extending through a trench between contact 152/154 and polysilicon layer 109—and optionally into polysilicon layer 109 as shown at 181—and electrically isolated by an oxide-filled barrel-trench 183), various other via structures may be implemented in alternative embodiments. In MEMS device embodiment 200 of FIG. 2, for example, vias 201 and 203 are formed by sputtered metal deposition on a sloped-wall trench—an approach that avoids the need for separate metal types/processes with respect to metal vent cover (seal) 105 and metal vias 201/203 (both may be implemented, for example, by the same sputtered metal). All the variations discussed above with respect to metal vent seal 105 apply equally in the embodiment of FIG. 2 and, more generally, vias formed as shown in FIG. 1 or 2 may be implemented with different vent-seal materials and/or processes, including narrow-passage epitaxial silicon vent seals as discussed below.

Figure 3:
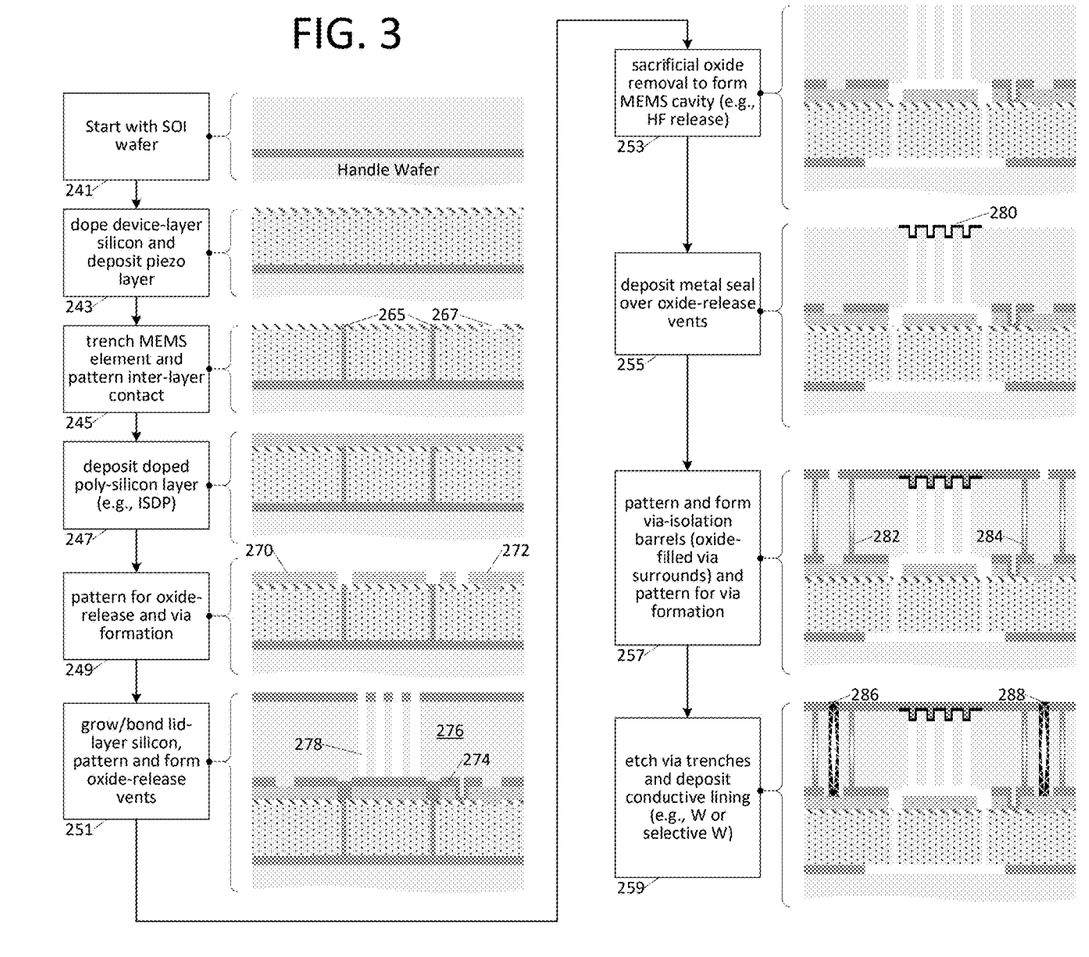
FIG. 3 illustrates an exemplary fabrication process with respect to the MEMS embodiment of FIG. 1.

FIG. 3 illustrates an exemplary fabrication process with respect to the MEMS embodiment of FIG. 1. Starting from a silicon-on-insulator (SOI) structure at 241 (i.e., buried oxide sandwiched between single-crystal-silicon handle layer and single-crystal-silicon device layer), device-layer silicon is doped to a desired level (e.g., degenerately doped with an n-type impurity concentration of at least $1E19/cm^3$ in at least one embodiment) followed by deposition of piezoelectric layer at 243 (e.g., aluminum nitride (AlN), though other piezoelectric materials may be used). At 245, a trench 265 that defines the MEMS element (e.g., outlines MEMS resonator) is formed through dielectric layer and doped silicon layer (i.e., trench extending to the buried oxide, separating that resonator from surrounding sidewalls of the silicon device layer) and filled with sacrificial oxide, and a through-dielectric contact region 267 is patterned. Doped polysilicon is deposited at 247, then patterned at 249 to segregate contact regions 270 and 272 and prepare for eventual oxide release and conductive via formation. At 251, over-poly oxide layer 274 is deposited and patterned for contact formation, followed by deposition of lid-layer silicon 276 (e.g., deposited epitaxially, through wafer-bonding, etc.), patterning for release vent formation and then etching to form oxide-release vents 279. Hydrofluoric acid (HF) release or other oxide release is executed at 253 (e.g., generally a vapor etch using a bubbled hydrofluoric acid solution or anhydrous hydrofluoric acid gas, though any fluid-phase (gas/vapor or liquid) release-etch may be employed) to form the MEMS cavity, followed at 255 by deposition of metal seal 280 to seal the oxide-release vents—an operation carried out, for example, at relatively low temperature (less than 400° C. in a number of sputtered metal processes) and without problematic material deposition within the MEMS cavity. At 257, via-isolation barrels 282 and 284 are patterned, etched and filled with oxide, followed by surface oxide deposition and contact-via patterning. Via trenches are etched and lined (or filled with) conductive material at 259 (e.g., tungsten or selective tungsten, the latter depositing on single-crystal or polycrystalline silicon, but not oxide) to finish conductive vias 286 and 288—structures that may thereafter be overlaid with contact metal, followed by passivation to yield the FIG. 1 embodiment.

Figure 2:
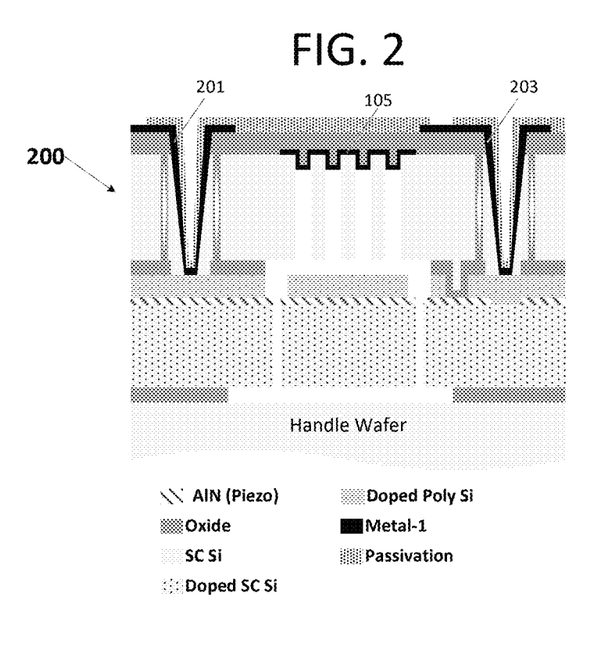
FIG. 2 illustrates an embodiment of a MEMS device having metal-sealed oxide-release vents and tapered contact vias.
Figure 4:
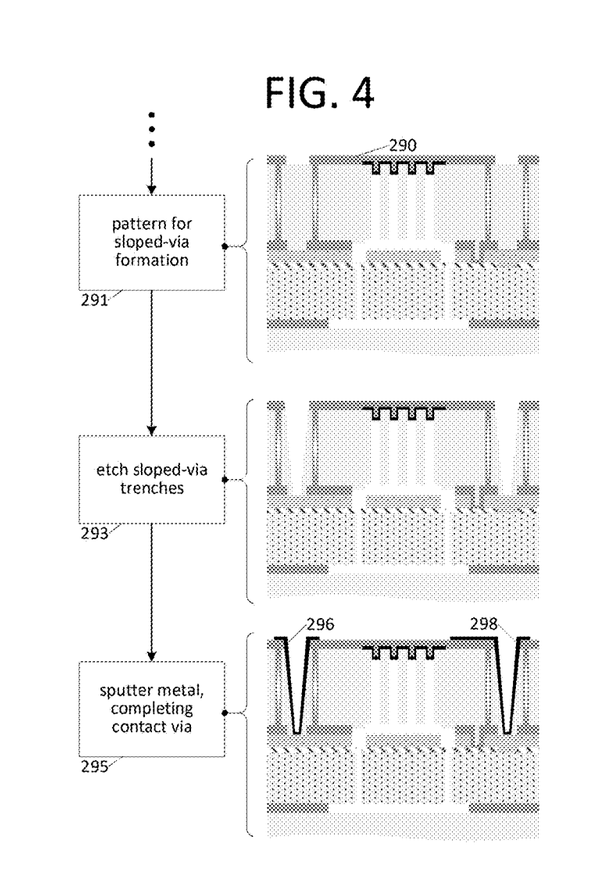
FIG. 4 illustrates an exemplary fabrication process with respect to the MEMS embodiment of FIG. 2.

FIG. 4 illustrates an exemplary fabrication process with respect to tapered-via MEMS embodiment of FIG. 2—after oxide-release and release-vent sealing operations (e.g., as shown at 253 and 255 in FIG. 3) have been completed and via-isolation barrels have been formed. Surface oxide 290 is patterned (291) in preparation for tapered-via formation, followed by etching of sloped via trenches at 293. Metal is deposited at 295 (e.g., through sputtering) to complete contact vias 296 and 298, followed by passivation to yield the FIG. 2 embodiment.

Figure 5:
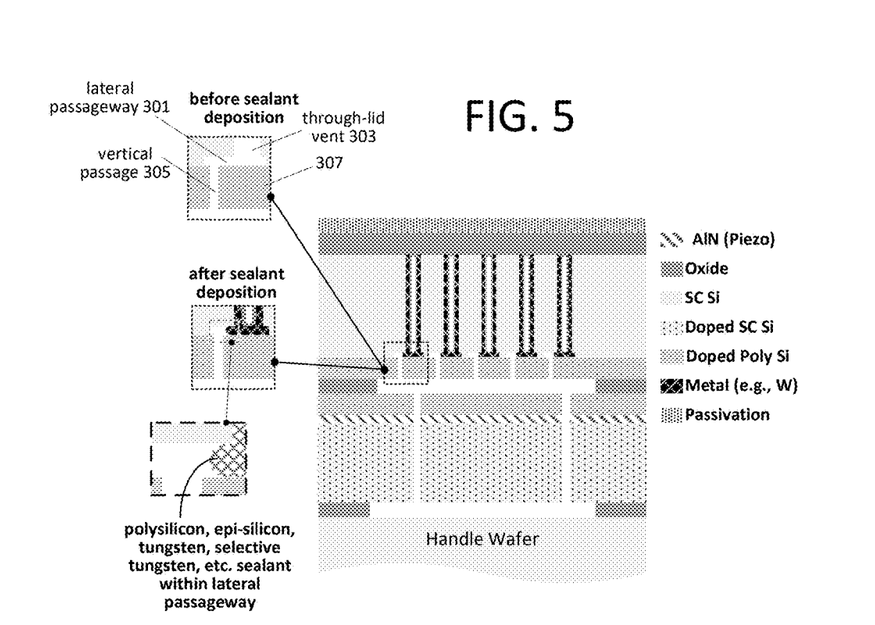
FIGS. 5 and 6 illustrate alternative embodiments in which oxide in a MEMS cavity is released through relatively small capillary passageways extending between the MEMS cavity and larger through-lid vents.
Figure 6:
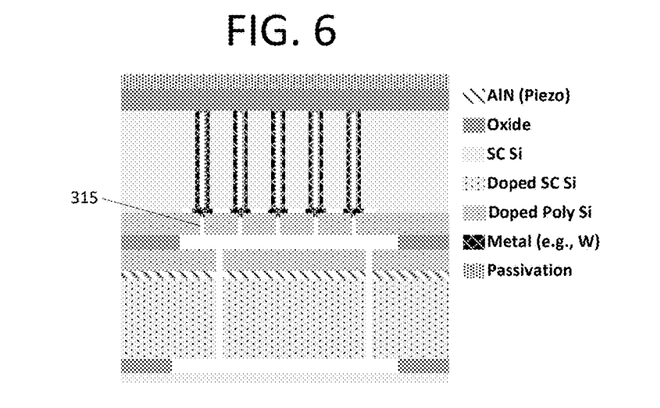

FIGS. 5 and 6 illustrate alternative embodiments in which oxide in the MEMS cavity is released through relatively small capillary passageways extending between the MEMS-element cavity and larger through-lid vents; passageways sufficiently narrow (constricted) to be closed off with relatively small sealant volume and to prevent propagation of vent sealant into the MEMS cavity itself.

In the embodiment of FIG. 5, the oxide-release path includes relatively narrow (high aspect-ratio) lateral passageways 301 that extend between through-lid vents 303 and vertical pathways 305 (the latter extending to/into the cavity through doped polysilicon layer 307 in this example) along respective axes substantially orthogonal to extensional axes of the passages they interjoin (i.e., vents 303 and vertical pathways 305)—a geometry that lacks line-of-sight passage from the lid-layer vent opening to the MEMS cavity and thus no straight-line path for undesired vent-sealant deposition into the MEMS cavity (i.e., vents 303 and pathways 305 extend/are routed along non-concentric parallel axes). Also, while the minimum aperture-size/aspect-ratio of through-lid vents 303 is generally constrained by requirements of the relatively deep etch through the silicon lid layer, lateral passageways 301 may be implemented with significantly smaller aperture height (e.g., less than 200 nanometers, or less than 100 nanometers) or higher length-to-aperture aspect ratio (e.g., as small as 9:1). Accordingly, lateral passageways 301 are readily plugged by various materials deposited to line or fill the through-lid trench including, without limitation, polysilicon, epitaxial silicon, tungsten, selective tungsten and so forth. Moreover, in the case of epitaxial silicon deposition, temperatures may be reduced relative to those effected by less restrictive (larger aperture) release vents, avoiding (or at least mitigating) degradation of temperature susceptible material layers. In any case, sealant material deposited into the through-lid vent paths extrudes (or otherwise flows) into the lateral-passageways, blocking those capillaries to hermetically seal the MEMS cavity.

In the embodiment of FIG. 6, narrow, small-aperture passageways 315 are formed vertically directly beneath the larger-aperture through-lid vents—a capillary "straw" approach that exposes line-of-sight access into the MEMS cavity in return for potentially simplified fabrication. That is, each passageway 305 extends (is routed) along an axis through which the adjoined through-lid vent also extends—a shared axis that may or may not be concentric with respect to either segment of the collective pathway. As in the embodiment of FIG. 5, narrow (capillary) passageways 315 are dimensioned to permit fluid-phase oxide removal while limiting through-passage of sealant material (e.g., tungsten, selective tungsten, polysilicon, epitaxial silicon, etc.), permitting sufficient ingress into the capillary to seal the oxide-release vent without (or with negligible) sealant entry into the MEMS cavity.

Still referring to FIG. 6, the leftmost capillary passageway 315 and corresponding through-lid vent are positioned over the field area of the MEMS device and not over the MEMS cavity itself. This arrangement may further reduce propagation of sealant into the MEMS cavity and may be applied with respect to any or all the oxide-release vents in the FIG. 6 embodiment. More generally, over-field-area release-vent placement may be implemented with respect to any of the embodiments presented herein—that is, any or all oxide-release vents or component passages thereof may be disposed over the field area in such embodiments (e.g., outside the perimeter defined by the trench through the device-layer silicon) instead of over the MEMS cavity.

Figure 7:
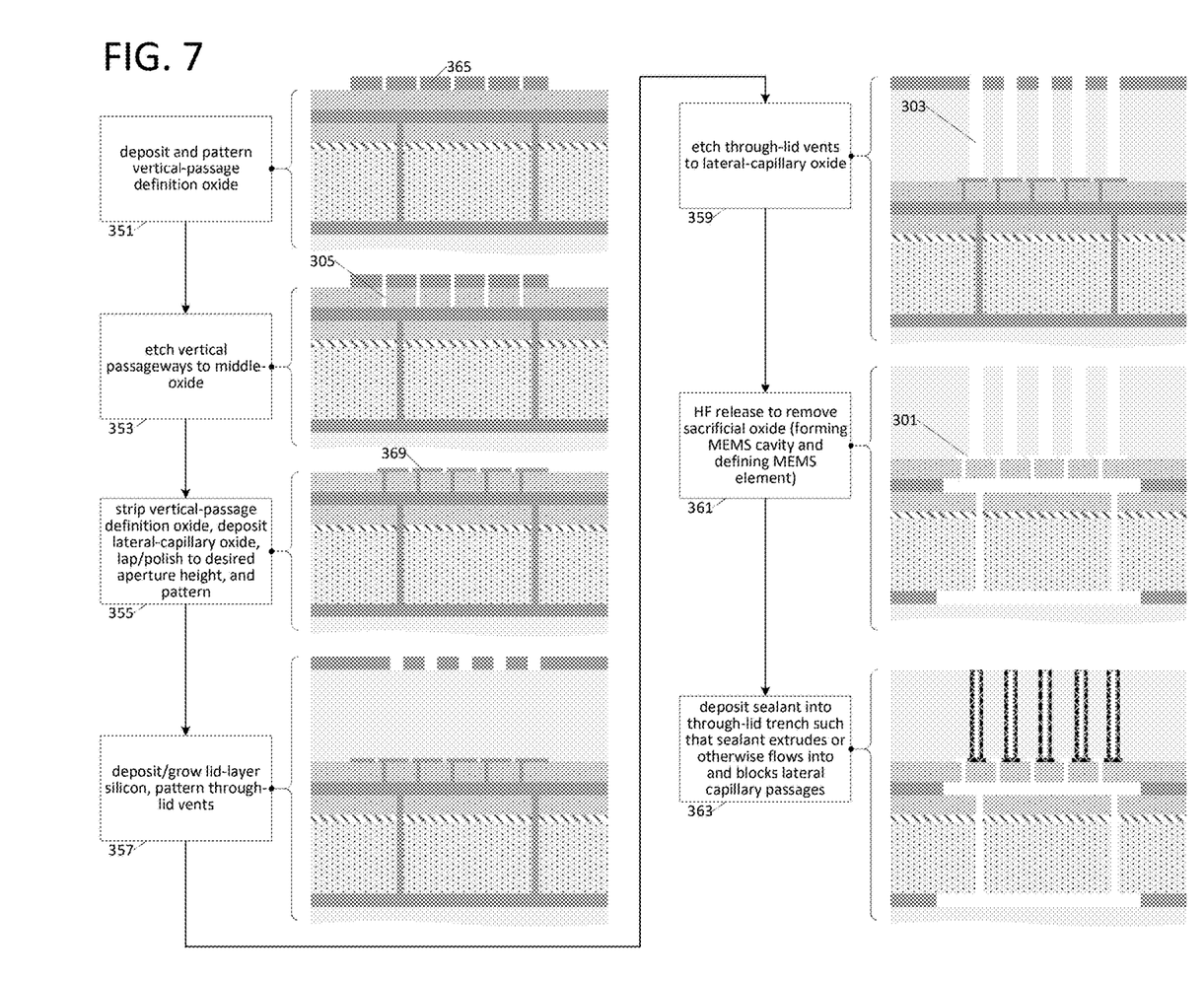
FIGS. 7 and 8 illustrate exemplary fabrication processes corresponding to the narrow-passageway oxide-release vents shown in FIGS. 5 and 6, respectively.
Figure 8:
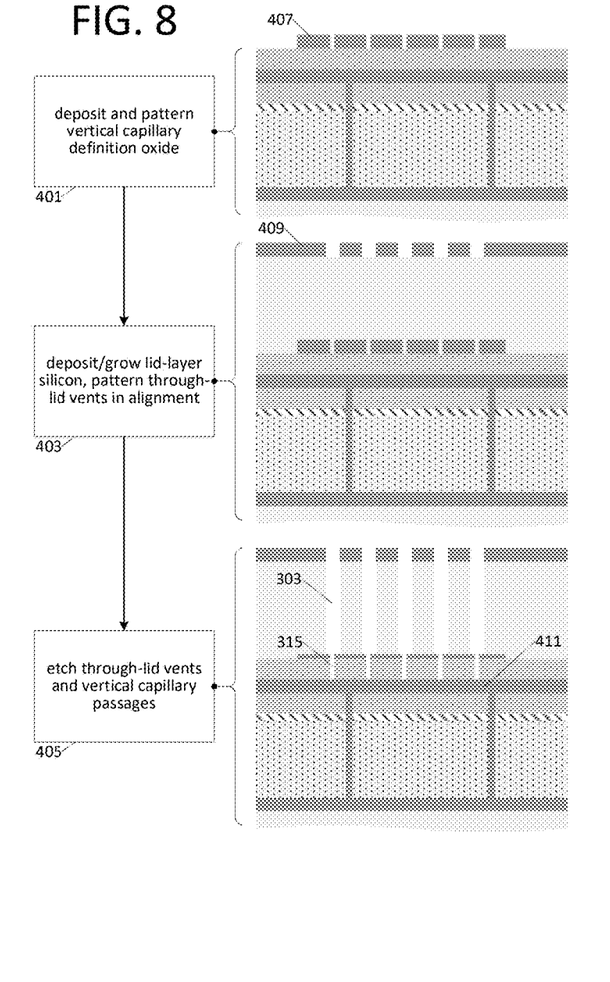

FIGS. 7 and 8 illustrate exemplary fabrication processes corresponding to the narrow-passageway oxide-release vents shown in FIGS. 5 and 6, respectively. Starting at 351 in FIG. 7, vertical-passage definition oxide 365 is deposited (in this case over doped polysilicon) and patterned, followed by vertical passageway etch at 353. In the depicted embodiment, the vertical passageways (305) are themselves dimensioned as capillary (narrow aperture, high aspect ratio) passages, though larger-aperture vertical passageways may be implemented. At 355, the vertical-passage definition oxide is stripped followed by deposition, an optional back-grind (or lap, polish or other practicable planarizing ablation) and patterning of lateral-capillary oxide 369 to yield a desired lateral capillary passage height. At 357, lid-layer silicon is deposited (e.g., wafer bond, epitaxial growth, etc.) followed by deposition of sacrificial surface oxide and patterning for ensuing etch at 359 to form through-lid vents 303. Vapor-phase or liquid-phase oxide release (e.g., vapor-phase HF release) is carried out at 361 to remove sacrificial oxide, including the lateral-capillary oxide (leaving lateral capillary passages 301), vertical-passage oxide and sacrificial oxides within the MEMS cavity. At 363, vent-sealant material (e.g., tungsten, selective tungsten, polysilicon, epitaxial silicon, etc.) is deposited into the through-lid vents, extruding (or otherwise flowing) into and hermetically sealing the lateral capillary passageways (and thus sealing the MEMS cavity).

Turning to the capillary-straw formation in FIG. 8, vertical-capillary definition oxide 407 is deposited (in this case over doped polysilicon) and patterned to yield a desired capillary aperture dimension at 401. Though not specifically shown, capillary definition oxide 407 may be back-ground (lapped, polished, etc.) to enable reduced aperture dimension relative to that achievable through thicker oxide layers. In any case, lid-layer silicon is deposited at 403, followed by deposition and patterning of surface oxide 409 to enable formation of through-lid vents axially aligned (or otherwise disposed in line) with apertures in capillary definition oxide 407. Accordingly, deep-trench etching at 405 yields through-lid vents 303 in alignment with capillary passages 315 to interstitial oxide 411. Fluid-phase oxide release may be carried out thereafter to remove sacrificial oxide and form the MEMS cavity followed by sealant deposition into the lid-layer trenches to seal the vertical capillary passages as shown in FIG. 6.

Figure 9:
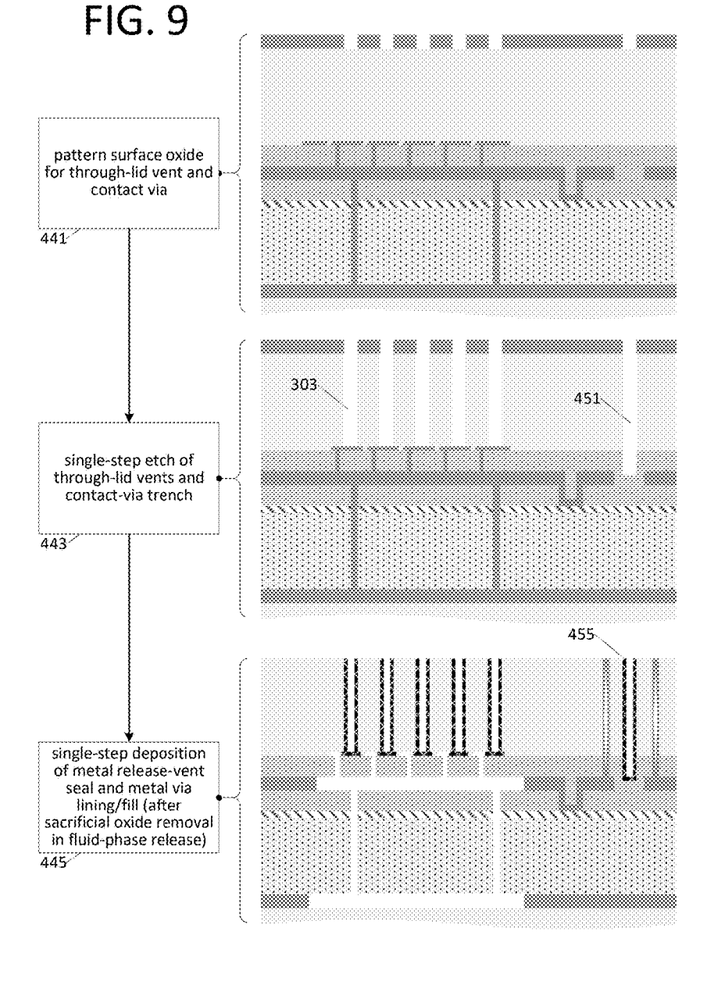
FIGS. 9-11 illustrate examples of process efficiency achieved through concurrent feature formation with respect to the capillary oxide-vent embodiments of FIGS. 5 and 6
Figure 10:
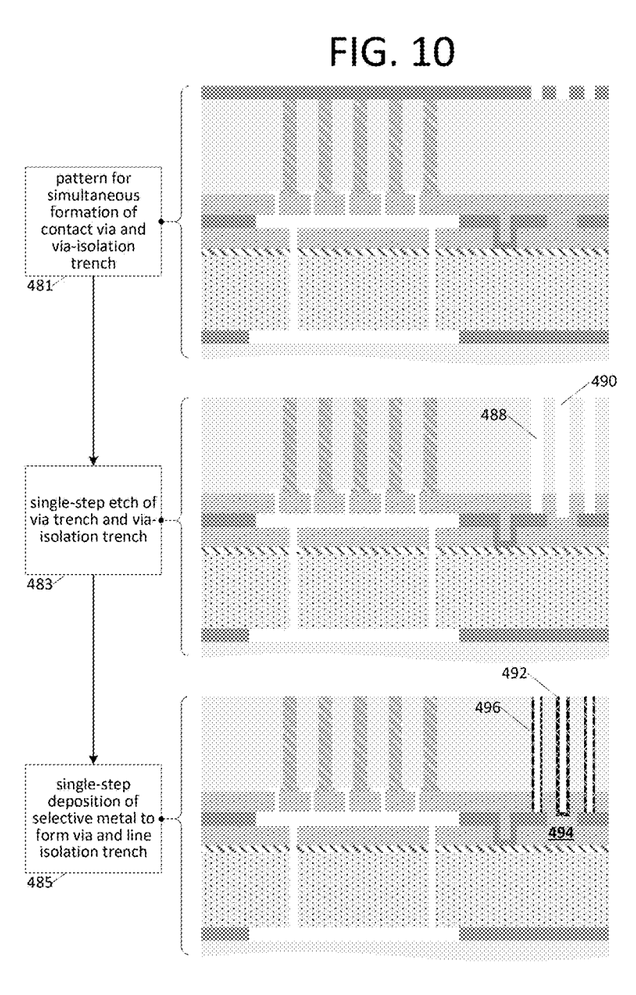
Figure 11:
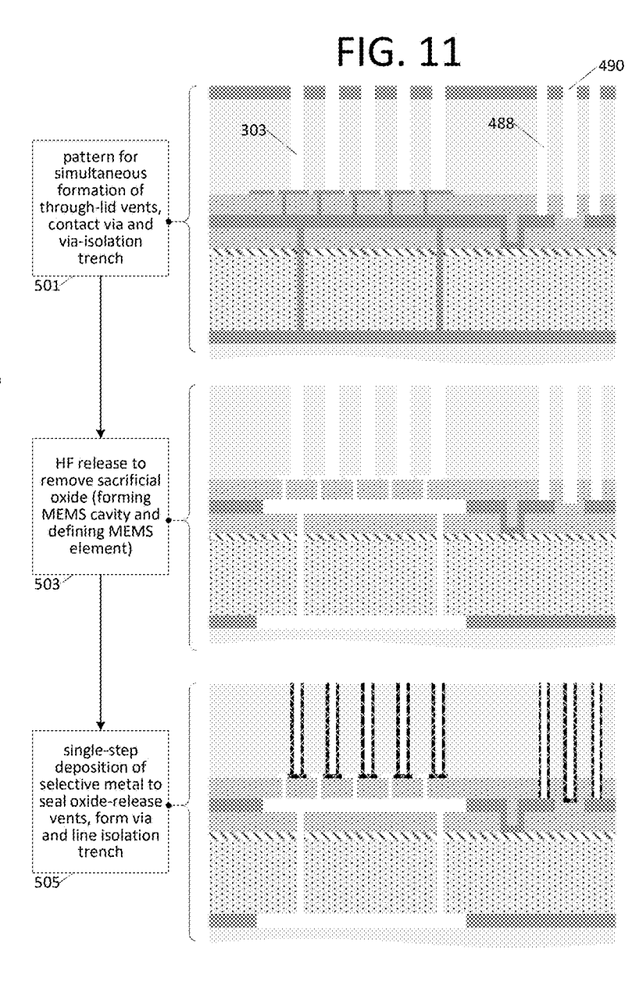

FIGS. 9-11 illustrate examples of process efficiency achieved through concurrent feature formation with respect to the capillary oxide-vent embodiments of FIGS. 5 and 6. Referring first to FIG. 9 (depicted in the context of lateral capillary embodiment of FIG. 5, but equally applicable to vertical capillary embodiment of FIG. 6 as well as embodiments that lack capillary oxide-release passageways), the surface oxide is patterned at 441 for formation of both through-lid vents and contact vias (patterning for only one contact-via being depicted). A single etching step is then carried out at 443 to form both through-lid vents 303 and contact via trench 451, followed by a single-step deposition of a highly conductive material such as metal or highly-doped silicon at 445 to both seal the release vents (e.g., within narrow lateral passageways in the embodiment shown, or within narrow vertical passageways in the vertical capillary process) and form contact via 455. Though not specifically shown, subsequent etching and oxide deposition may be carried out to form via isolation structure (surrounding contact via 455), followed by surface contact deposition and passivation deposition to complete the MEMS device.

In the exemplary process flow of FIG. 10, a surface oxide is patterned (after oxide-release and vent-seal) at 481 to enable formation of conductive-via and via-isolation trenches, followed by single-step (concurrent or simultaneous) etching of those trenches at 483 (yielding isolation trench 488 and via trench 490). At 485, selective metal (e.g., selective tungsten or other conductive material that will deposit on silicon or polysilicon, but not oxide) is deposited concurrently (in a single deposition step) within via trench 490 and isolation trench 488, forming a conductive via 492 that extends to polysilicon region 494 and simultaneously lining the sides but not the oxide-layer stop of the via-isolation trench. The conductive isolation lining (496) may, in some embodiments, be coupled to ground or other reference potential to form a shielded conductive path through the MEMS device layers (in which case the conductive isolation 496 may electrically isolated from other regions of the MEMS device by one or more other isolation structures). As in FIG. 9, surface-contact and passivation depositions may be carried out to complete the MEMS device with the surface-contact metal isolated from via-isolation lining 496 by an oxide or other dielectric.

In the FIG. 11 process flow example, a surface oxide is patterned at 501 to enable concurrent formation of through-lid release vents 303, via-isolation trench 488 and contact-via trench 490, followed by a single-step etch to form those structures. Vapor-phase or liquid-phase oxide release (e.g., HF release) is carried out at 503 to remove (evacuate, eliminate, rid) sacrificial oxide, including the lateral-capillary oxide (leaving lateral capillary passages), vertical-passage oxide and sacrificial oxides within the MEMS cavity. At 505, a selective-metal or highly-doped silicon is deposited concurrently within the through-lid release vents, the via trench and the isolation trenches, sealing the lateral oxide-release passageways (i.e., as discussed above), forming the conductive via and isolating the via in a single material deposition step. As before, surface-contact and passivation depositions may be executed to complete the MEMS device.

For MEMS resonators implemented with silicon and piezoelectric material layers (e.g., aluminum nitride as the piezoelectric layer), the temperature dependence of the silicon layer's elastic modulus and thus the temperature dependence of the resonator frequency may be reduced by degenerately doping the silicon. In some MEMS devices, it may be desirable to dope regions of the silicon structural layer to enable ohmic contact to deposited materials (e.g. metals, doped semiconductors) or to otherwise modify their mechanical and/or electrical properties. Although high dopant concentrations can be achieved through surface diffusion-doping (i.e., deposition of a dopant source such as phospho-silicate glass or boro-silicate glass on the silicon layer surface, followed by a high temperature thermal drive or anneal), dopant penetration for practicable thermal drive periods tends to be limited (and/or require prohibitively long drive periods for silicon layers thicker than ~5-6 μm).

Figure 12:
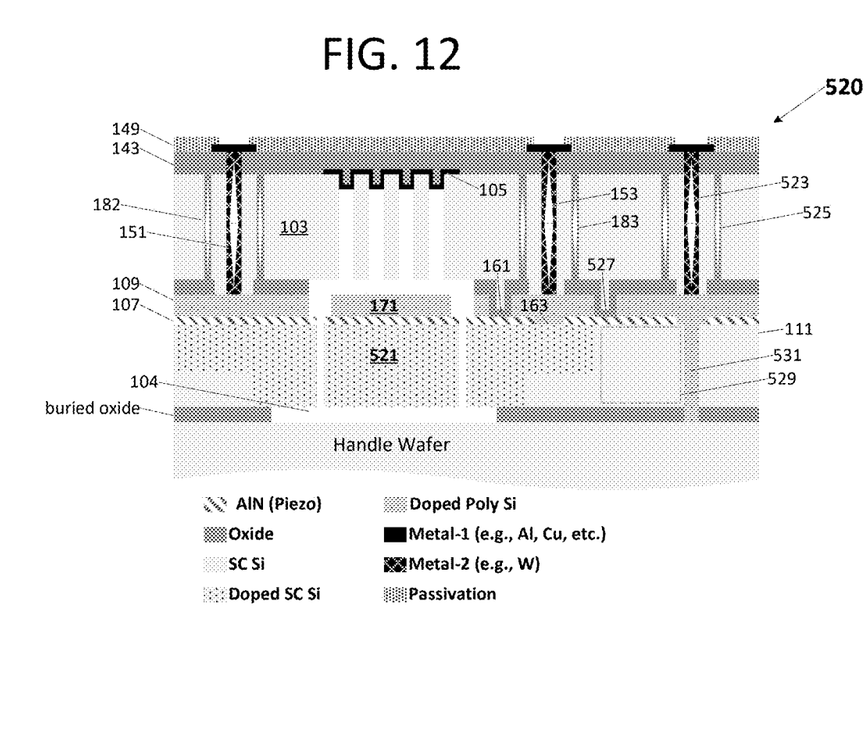
FIG. 12 illustrates an embodiment of a MEMS device having a laterally-doped, piezoelectrically-actuated MEMS resonator.
Figure 13:
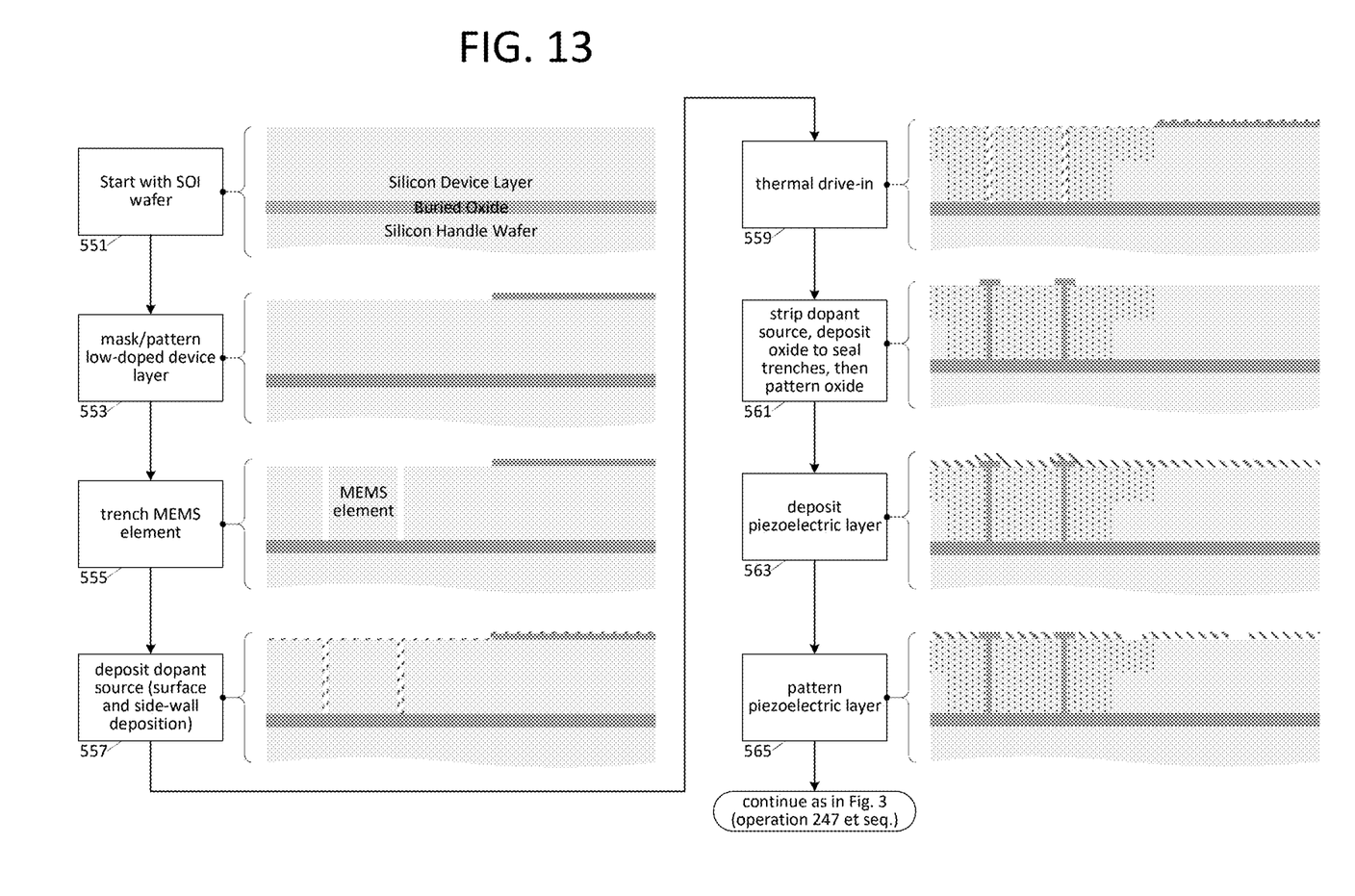
Figure 14:
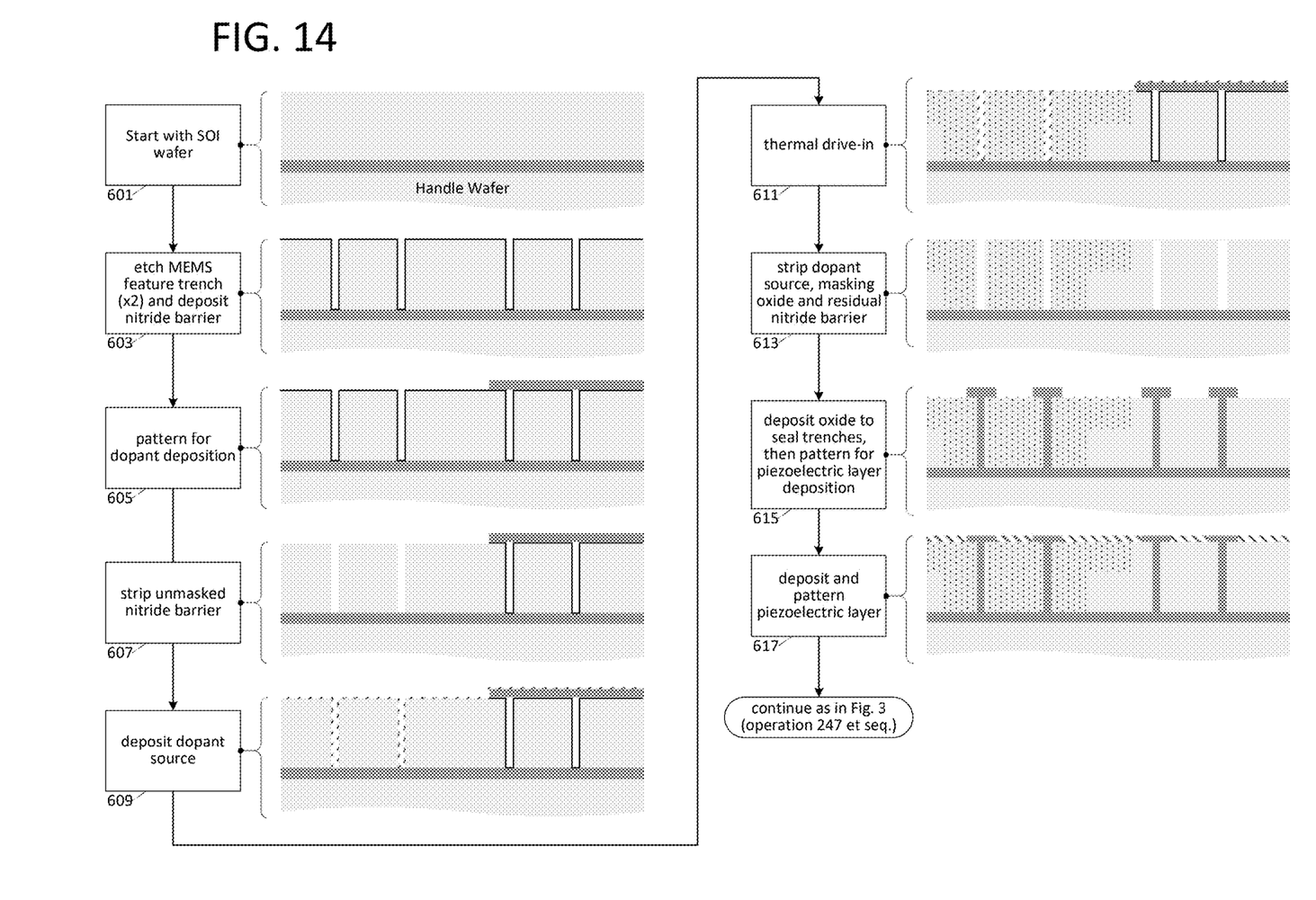

In embodiments shown in FIGS. 12-14, doping (including degenerate doping) depth for a thermal drive of a given duration is increased by etching or otherwise forming slots within the silicon layer and depositing a dopant-source film on the sidewalls of the slots prior to the thermal drive. Through this lateral doping approach (which may be combined with surface-layer doping) the diffusion time is only limited by the spacing of the slots rather than the thickness of the silicon film. The slots may also serve a dual purpose—not only enabling more rapid (or deeper) doping, but also defining the silicon MEMS structure of the resonator (i.e., defining sides of the silicon portion of the resonant MEMS structure).

In a number of processes, formation of dopant-delivery slots in the silicon layer may enable subsequently deposited and patterned materials (e.g., piezoelectric material layer) to occupy the slots—an undesirable result, particularly where the slots separate the resonant MEMS structure from the surrounding silicon. On the other hand, forming dopant-delivery slots and executing the diffusion drive cycle after piezoelectric material deposition may subject the piezoelectric film to a prohibitively high (i.e., degradative) temperature.

In embodiments depicted in FIGS. 12-14, lateral doping challenges are overcome through a slot cap-off approach in which a silicon oxide film is deposited over dopant-delivery slots (i.e., after dopant has been deposited on silicon sidewalls defined by the slots and thermally diffused into the silicon layer) prior to surface deposition of piezoelectric or other material layers. Through this approach, the piezoelectric material and/or other material layers may be deposited and patterned without fouling the slots or exposure to diffusion-drive temperatures. In general, the slot-capping silicon oxide film is sufficiently thick to cover (and/or partially or completely fill) the dopant-delivery slots (trenches) and may be etched or polished back to a reduced thickness. In a number of embodiments, for example, the silicon oxide is completely removed from the silicon surface (leaving it only in the slots) prior to deposition of piezoelectric or other material layers. In other embodiments, the silicon oxide layer is patterned and a piezoelectric film (e.g. aluminum nitride) is deposited on top. Additional layers such as polysilicon (including degenerately doped polysilicon) and further oxide may be deposited and patterned over the piezoelectric layer to create electrodes, diodes and/or other structures. The piezoelectric film may be patterned prior to and/or after deposition of these additional layers. Other oxide films may be used to cap-off dopant delivery slots in alternative embodiments.

FIG. 12 illustrates an embodiment of a MEMS device 520 having a laterally-doped (e.g., degenerately n-doped), piezoelectrically-actuated MEMS resonator 521—that is, a MEMS resonator 521 subject to dopant drive-in through resonator sidewalls (at least) prior to deposition of piezoelectric layer 107. Features above piezoelectric layer 107, including metal release-vent seal 105, through-silicon vias 151, 153 and 523 and corresponding isolation structures 181, 183 and 525, surface oxide 143, passivation layer 149, middle-oxide isolation features at 161 and 527) and doped polysilicon region 171 are implemented generally as discussed above (e.g., in reference to FIG. 1). As in FIG. 1, electrical vias 151 and 153 extend through the lid-layer silicon 103 to contact sub-surface structures (e.g., MEMS resonator drive/sense electrode(s), MEMS resonator-bias electrode(s), thermistor terminals, MEMS accelerometer-mass bias/sense electrodes, etc.), while via 523 extends to an isolated region of doped-polysilicon layer 109 (isolated by oxide feature 527) and thus, by way of doped-poly trench-fill 531, to the handle wafer (e.g., extending through the buried oxide layer to ground the handle, provide electrical shielding, etc.).

In the specific embodiment shown, region 529 of single-crystal silicon device layer 111 is masked during doping of resonator feature 521 and thus remains undoped (or lightly n-doped or lightly p-doped) to enable formation of additional features (electrostatic discharge protection elements and/or one or more other MEMS structures such as resonators, thermistors, etc.). In alternative embodiments, undoped region 529 may be trenched prior to piezoelectric layer deposition (e.g., to define other MEMS structures), or may include other more localized depositions and/or diffusions (e.g., one or more n-doped regions to form diode(s) within an electrostatic discharge protection element. Where no such other MEMS structures or diode-isolation regions are needed, undoped region 529 may be omitted altogether.

FIG. 13 illustrates an exemplary process flow for implementing MEMS device 520 of FIG. 12, starting with a silicon-on-insulator wafer as shown at 551. At 553, oxide is deposited and patterned over the silicon device layer to avoid subsequent dopant diffusion into the region thereunder and thus maintain a low-doped/non-doped silicon region. One or more trenches are etched within the device-layer silicon at 555 to define at least one MEMS element, followed by deposition of a dopant source on the surface and trench side-walls as shown at 557. Accordingly, following a thermal anneal or drive-in at 559, dopant diffuses laterally into the MEMS element and into the adjacent field areas. In one embodiment, the MEMS element is dimensioned with a relatively narrow width (e.g., less than 12 μm) such that dopant diffuses all the way through the MEMS element. In such an embodiment, dopant deposition may be masked at the surface of the MEMS element (and from the surface of the adjacent field area if desired). In any case, the dopant source is stripped at 561, followed by oxide deposition to seal the trenches and oxide patterning in preparation for piezoelectric layer deposition. At this point, the silicon device layer is constituted by distinct doped and undoped regions—the former being doped to any practicable dopant concentration (e.g., above $1E19/cm^3$, $1E20/cm^3$, $2E20/cm^3$, or higher concentration of n-type or p-type dopant). The piezoelectric layer is deposited at 563 and then patterned for electrical (via) interconnect at 565. At this point, features above the piezoelectric layer may be formed (deposited, etched or otherwise fabricated) generally as shown in FIG. 3 (e.g., operations starting at process step 247).

FIG. 14 illustrates another exemplary process for fabricating MEMS device 520 of FIG. 12, again starting with a silicon-on-insulator wafer (601). At 603, one or more trenches are etched to define MEMS features (two trenches in this case) and a nitride barrier (e.g., silicon nitride) is deposited-lining the trench walls or otherwise plugging the trenches as shown. At 605 oxide is deposited and patterned in preparation for dopant deposition, followed by stripping unmasked nitride barrier at 607. At 609 dopant source is deposited, lining the trench walls and unmasked surface of the silicon device layer as shown. Thermal drive-in is carried out at 611 to yield the doped single-crystal silicon pattern shown in MEMS device 520, while maintaining undoped region beneath the oxide/nitride mask. At 613 the dopant source, masking oxide and residual nitride barrier are stripped and, at 615, oxide is deposited to seal the trenches and then patterned in preparation for piezoelectric layer deposition. The piezoelectric layer is deposited and 617 and patterned in preparation for electrical interconnect formation. As in the FIG. 13 fabrication process, features above the piezoelectric layer may be formed at this point generally as shown starting at 247 in FIG. 3.

Figure 15:
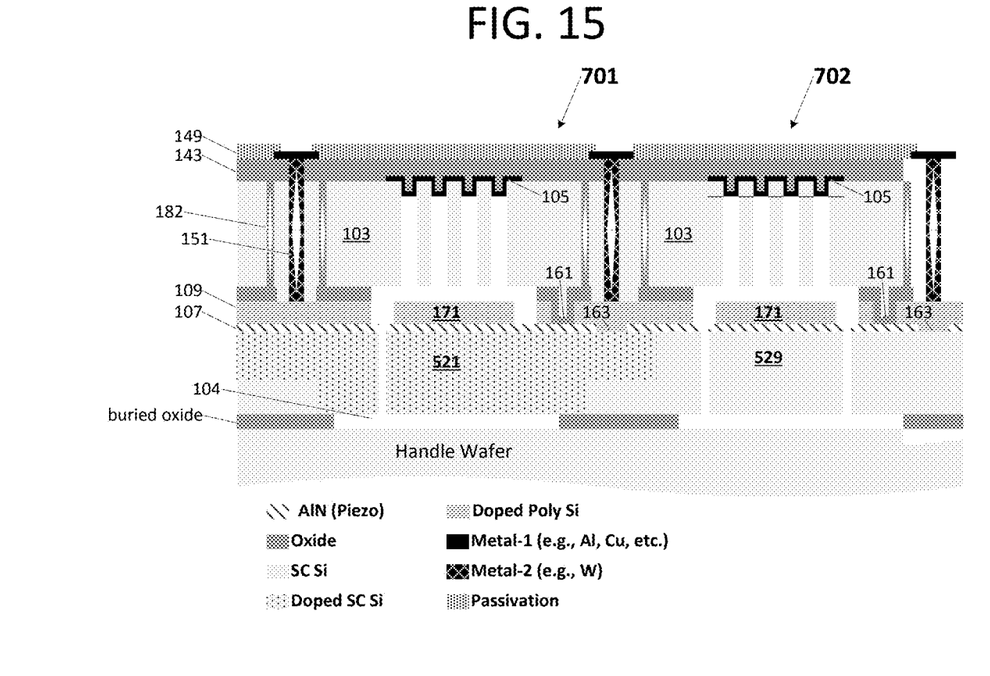

Referring to FIG. 15, the MEMS elements formed within the differently doped regions of the silicon device layer may include, for example and without limitation, two different MEMS resonators 701 and 702 having substantially/purposefully different temperature-coefficients of frequency (TCF) and/or one or more MEMS resonator in combination with an alternative MEMS element such as a thermistor, accelerometer mass, optical feature, and so forth. Where two MEMS resonators are implemented, the resonator within the more heavily doped device-layer silicon region (e.g., having a dopant concentration of 1E19/cm3 or higher and a dopant concentration 10, 100, 1000 or more times the dopant concentration of the undoped/lightly-doped region of the device-layer silicon) may have substantially reduced temperature sensitivity relative to the resonator implemented within the less doped silicon region, for example, to enable temperature detection (or temperature-change detection) based on comparison or other evaluation of the resonant frequencies. In one embodiment, for example, the first-order TCF of the temperature-sensitive resonator (e.g., implemented within the less-doped silicon region) is at least 10 times (or 100 times or more) the first-order TCF of the less-temperature-sensitive resonator.

In the foregoing description and in the accompanying drawings, specific terminology and drawing symbols have been set forth to provide a thorough understanding of the disclosed embodiments. In some instances, the terminology and symbols may imply specific details not required to practice those embodiments. For example, any of the specific materials, dimensions (thicknesses), concentrations, operational order (e.g., order of device fabrication steps), temperatures and the like can be different from those described above in alternative embodiments. Oxides may include various silicon oxides (e.g., silicon dioxide ($SiO_2$, silicon oxynitride ($SiO_xN_y$), etc.) and/or other dielectric materials compatible with silicon wafer processing. The term "coupled" is used herein to express a direct connection as well as a connection through one or more intervening functional components or structures. The terms "exemplary" and "embodiment" are used to express an example, not a preference or requirement. Also, the terms "may" and "can" are used interchangeably to denote optional (permissible) subject matter. The absence of either term should not be construed as meaning that a given feature or technique is required.

Various modifications and changes can be made to the embodiments presented herein without departing from the broader spirit and scope of the disclosure. For example, features or aspects of any of the embodiments can be applied in combination with any other of the embodiments or in place of counterpart features or aspects thereof. Accordingly, the specification and drawings are to be regarded in an illustrative rather than a restrictive sense.

What is claimed is:

1. A semiconductor device comprising:
   a first silicon layer, a second silicon layer and a third silicon layer;
   the first silicon layer being disposed between the second silicon layer and the third silicon layer, the first silicon layer having first and second regions, the first and second regions being differently doped from one another;
   a first microelectromechanical system (MEMS) resonant structure formed with the first region;
   a second MEMS resonant structure formed with the second region;
   a piezoelectric layer disposed over the resonant structure of the first silicon region; and
   a conductive material disposed over the piezoelectric layer and patterned to form first and second electrodes;
   wherein the first MEMS resonant structure and the second MEMS resonant structure have respective first-order temperature coefficients of frequency that differ from one another due, at least in part, to the different dopant concentrations of the first and second regions of the first silicon layer; and wherein the first order temperature coefficient of frequency of the resonant structure formed with the second region of the first silicon layer is at least ten times greater than the first-order temperature coefficient of frequency of the resonant MEMS member with the first region of the first silicon layer.

2. The semiconductor device of claim 1 wherein the first region of the first silicon layer has a dopant concentration of at least $1E19/cm^3$ and the second region of the first silicon layer has a dopant concentration less than $1E18/cm^3$.

3. The semiconductor device of claim 1 wherein the piezoelectric layer comprises aluminum nitride.

4. The semiconductor device of claim 1 wherein the conductive material has a dopant concentration of at least $1E19/cm^3$.

5. The semiconductor device of claim 1 further comprising exposed first and second electrical contacts which are electrically coupled to the first and second electrodes, respectively.

6. The semiconductor device of claim 1 wherein the conductive material comprises doped polysilicon.

7. The semiconductor device of claim 1 wherein one of the first silicon layer and the third silicon layer comprises a lid layer, the lid layer having one or more oxide-release vents, and wherein the semiconductor device further comprises at least one sputtered metal material that plugs the one or more oxide-release vents.

8. The semiconductor device of claim 1 wherein the piezoelectric layer is disposed also over the second silicon region.

9. A method of fabricating a semiconductor device, the method comprising:
    providing a first silicon layer, a second silicon layer and a third silicon layer, the first silicon layer being disposed between the second silicon layer and the third silicon layer;
    forming, within the first silicon layer, first and second regions, wherein forming the first and second regions comprises differently doping the first and second regions;
    forming a first microelectromechanical system (MEMS) resonant structure with the first region of the first silicon layer and forming a second MEMS resonant structure with the second region of the first silicon layer;
    disposing a piezoelectric layer over the resonant structure of the first silicon region; and
    disposing a conductive layer over the piezoelectric layer in a pattern that forms electrically distinct first and second electrodes;
    wherein the first MEMS resonant structure and the second MEMS resonant structure have respective first-order temperature coefficients of frequency that differ from one another due, at least in part, to the different doping of the first and second regions of the first silicon layer; and
    wherein the first order temperature coefficient of frequency of the resonant structure formed with the second region of the first silicon layer is at least ten times greater than the first-order temperature coefficient of frequency of the resonant MEMS member with the first region of the first silicon layer.

10. The method of claim 9 wherein differently doping the first and second regions comprises doping at least one of the first and second regions of the first silicon layer such that the first region has a dopant concentration of at least $1E19/cm^3$ and the second region has a dopant concentration less than $1E18/cm^3$.

11. The method of claim 9 wherein disposing the piezoelectric layer over the resonant structure comprises disposing aluminum nitride over the resonant structure.

12. The method of claim 9 wherein disposing the conductive material comprises doping polysilicon to have a dopant concentration of at least $1E19/cm^3$.

13. The method of claim 9 further comprising exposing, on a surface of the second silicon layer, first and second electrical contacts that are electrically coupled to the first and second electrodes, respectively.

14. The method of claim 9 wherein disposing a conductive layer over the piezoelectric layer in a pattern that forms electrically distinct first and second electrodes comprises disposing doped polysilicon over the piezoelectric layer.

15. The method of claim 9 wherein one of the first silicon layer and the third silicon layer comprises a lid layer, and wherein the method further comprises forming one or more oxide-release vents in the lid layer, removing at least one material through the lid layer via one or more oxide-release vents, and sputtering at least sputtered metal material to plug the one or more oxide-release vents.

16. The method of claim 9 wherein the method comprises disposing the piezoelectric layer also over the second silicon region.

17. A method of fabricating a semiconductor device, the method comprising:
    providing a first silicon layer, a second silicon layer and a third silicon layer, the first silicon layer being disposed between the second silicon layer and the third silicon layer;
    forming, within the first silicon layer, a first region and a second region, wherein forming comprises differently doping the first region and the second region;
    forming a first microelectromechanical system (MEMS) resonant structure with the first region and forming a second MEMS resonant structure with the second region, wherein the forming of the first region and the second region, the forming of the first MEMS resonant structure and the forming of the second MEMS resonant structure are performed in a manner such that a first-order temperature coefficient of frequency (TCF) of the second MEMS resonant structure is at least ten times greater than the first-order temperature coefficient of frequency of the first MEMS resonant structure;
    disposing a piezoelectric layer over the first region; and
    disposing a conductive layer over the piezoelectric layer in a pattern that forms electrically distinct first and second electrodes;
    wherein differently doping comprises
        forming one or more trenches in the first silicon layer in a manner abutting the first region,
        depositing a dopant source into the one or more trenches as well as onto a surface of the first region,
        performing a thermally-anneal process to drive dopant from the dopant source into a top surface of the first region as well as into at least one lateral side of the first region, the at least one lateral side being defined by the one or more trenches.

18. The method of claim 17 wherein disposing the piezoelectric layer over the first silicon layer comprises disposing a layer of aluminum nitride over the first region.

19. The method of claim 17 wherein differently doping comprises doping the first region to have an n-type dopant concentration of at least $1E19/cm^3$.

20. The method of claim 17 wherein disposing the conductive material comprises doping polysilicon to have a dopant concentration of at least $1E19/cm^3$.

21. The method of claim 17 wherein one of the first silicon layer and the third silicon layer comprises a lid layer, and wherein the method further comprises forming one or more oxide-release vents in the lid layer, removing at least one material through the lid layer via one or more oxide-release vents, and sputtering at least sputtered metal material to plug the one or more oxide-release vents.

22. The method of claim 17 wherein the method comprises disposing the piezoelectric layer also over the second silicon region.

* * * * *